United States Patent
Frey et al.

[11] Patent Number: 5,978,220
[45] Date of Patent: Nov. 2, 1999

[54] LIQUID COOLING DEVICE FOR A HIGH-POWER SEMICONDUCTOR MODULE

[75] Inventors: Toni Frey, La Jolla, Calif.; Alexander Stuck, Wettingen; Raymond Zehringer, Künten, both of Switzerland

[73] Assignee: Asea Brown Boveri AG, Baden, Switzerland

[21] Appl. No.: 08/955,094

[22] Filed: Oct. 21, 1997

[30] Foreign Application Priority Data

Oct. 23, 1996 [DE] Germany ............................ 196 43 717

[51] Int. Cl.⁶ ........................................... H05K 7/20
[52] U.S. Cl. .................... 361/699; 361/677; 361/689; 361/703; 165/80.4
[58] Field of Search .................... 361/676, 677, 361/689, 698, 699, 702, 711, 717, 703–704, 707, 715, 722, 718; 165/80.3–80.4, 185; 174/16.3

[56] References Cited

U.S. PATENT DOCUMENTS

| | | | |
|---|---|---|---|
| 4,652,970 | 3/1987 | Watari et al. ........................... | 361/385 |
| 4,724,611 | 2/1988 | Hagihara ................................. | 29/840 |
| 4,765,400 | 8/1988 | Chu et al. ............................... | 165/185 |
| 5,316,075 | 5/1994 | Quon et al. ............................. | 165/80.4 |
| 5,349,498 | 9/1994 | Tanzer et al. ........................... | 361/689 |

*Primary Examiner*—Leo P. Picard
*Assistant Examiner*—Anatoly Vortman
*Attorney, Agent, or Firm*—Oblon, Spivak, McClelland, Maier & Neustadt, P.C.

[57] ABSTRACT

In a liquid cooling device (1) for a high-power semiconductor module (14), which contains a plurality of heat-generating submodules (8a–h) arranged next to one another on a cooling surface (3) and is fusion-bonded to the cooling surface (3), an improved load cycle resistance is achieved by the liquid cooling device (1) having a housing (2) which encloses a liquid space (4), through which a cooling liquid flows, and the upper side of which forms the cooling surface (3), and by the housing (2) of the liquid cooling device (1), at least in the region of the cooling surface (3), consisting of a metal-ceramic composite material, the coefficient of thermal expansion of which is adapted to the coefficient of thermal expansion of the ceramic substrates or of the power semiconductor devices of the submodules (8a–h) and, by additional means (11a–h; 12) for improving the heat transfer between the cooling surface (3) and the cooling liquid being provided in the liquid space (4) of the liquid cooling device (1).

22 Claims, 1 Drawing Sheet

LIQUID COOLING DEVICE FOR A HIGH-POWER SEMICONDUCTOR MODULE

BACKGROUND OF THE INVENTION

1. Field of the Invention

The present invention relates to the field of power electronics. It concerns a liquid cooling device for a high-power semiconductor module, which contains a plurality of heat-generating submodules arranged next to one another on a cooling surface, each of the submodules comprising at least one power semiconductor device applied to an electrically insulating ceramic substrate and being fusion-bonded to the cooling surface on the underside of the ceramic substrate, and which liquid cooling device (1) has a housing (2) which encloses a liquid space (4), through which a cooling liquid flows, and the upper side of which forms the cooling surface (3).

2. Discussion of Background

High-power semiconductor modules are components for power electronics. A module generally contains a plurality of semiconductor devices, which may be combined to form a logical functional unit. Such modules (for example thyristor, IGBT or diode modules) are popular nowadays in the power range of up to 2500 V and a few 100 A and are used in particular in industrial drives. Examples of modules of the type mentioned are known from EP-A1-0 597 144 or from an article by T. Stockmeier et al., Reliable 1200 Amp 2500 V IGBT Modules for Traction Applications, IEEE IGBT Propulsion Drives Colloquium, London, April 1995.

So far, these modules have been used only to a very limited extent in traction drives. One of the reasons for this is the long-term reliability required, something which conventional modules have not so far provided. With the current state of the art, an important failure is the fatigue of the solder layers between the substrate on which the silicon chips are mounted and the water or liquid cooler connected to the module. This finally leads to overheating of the chips and to detachment of the electrical contacts. The effect is observed after a number of load cycles in which the chips are heated up to the maximum permissible operating temperature by means of the self-generated heat dissipated during operation and then cooled again to the temperature of the cooling water. The maximum number of load cycles after which the failure mentioned occurs depends here strongly on the temperature of the cooler, the temperature swing and the rate of the temperature change. Altogether, the achievable load cycle resistance is much too small for the requirements in the traction field to allow reliable use.

DE 42 44 721 A1 specifies semiconductor valves for electrical machines which have an integrated fluid cooling arrangement. Effective cooling is achieved, inter alia, by the base or cover of a cooling fluid duct being formed directly by the rear side of the semiconductor substrates or their ceramic insulating carrier. A disadvantage of this solution is that the insulating carrier or the semiconductor substrate must perform a dual function as an electrical insulator and a heat conductor. As a result, the choice of material is restricted very greatly, primarily to insulation ceramics, or compromises with regard to heat conductivity have to be accepted. Since, furthermore, the heat dissipation takes place entirely via the insulating carrier, the latter is dimensioned with a large surface area or width to increase the exchange area. On the other hand, the heat from the semiconductor elements, of small surface area, is produced very locally and, as can be demonstrated, spreads out laterally only slightly when passing through the semiconductor substrate and the insulating carrier. In this arrangement, therefore, an adequate cooling performance can be achieved only with difficulty. In addition, the cooling duct is composed relatively expensively from a plurality of materials, which moreover may have coefficients of expansion which differ from one another and, in particular, from the insulating carrier. Therefore, the cooling efficiency, thermal stability and service life of such modules become unsatisfactory.

SUMMARY OF THE INVENTION

Accordingly, one object of the invention is to provide a novel liquid cooling device for high-power semiconductor modules which drastically increases the load cycle resistance of the modules. The object is achieved in the case of a device of the type mentioned at the beginning by the liquid cooling device having a housing which, at least in the region of the cooling surface (3), is cast from a metal-ceramic composite material, the coefficient of thermal expansion of which is adapted to the coefficient of thermal expansion of the ceramic substrates or of the power semiconductor devices of the submodules (8a–h), and by additional means (11a–h; 12) for improving the heat transfer between the cooling surface (3) and the cooling liquid being provided in the liquid space (4) of the liquid cooling device (1).

The invention is based on the recognition that an adaptation of the coefficients of thermal expansion of the substrate, which serves as a cooling surface, and to which the submodules are fusion-bonded (for example soldered), to the coefficients of thermal expansion of the submodules can allow the thermomechanical stressing to be reduced and consequently fatigue of the fusion joint to be prevented or greatly reduced. By contrast, in conventional modules, the cooling devices are typically made from customary metal alloys such as aluminum or copper, which have a high coefficient of thermal expansion of about 15–23 ppm/K, which harmonizes poorly with the coefficients of thermal expansion of the silicon of the chips and of the ceramic substrates, which lie in the range of only a few ppm/K.

According to a first preferred embodiment of the invention, the coefficient of thermal expansion of the housing material is to be less than 10 ppm/K, preferably less than 7 ppm/K. This achieves an adaptation in the coefficient of thermal expansion of the fusion-bonded parts, by which the thermomechanical stresses are reduced to such an extent that fatigue of the bond is virtually prevented. It is particularly favorable if, according to a development of this embodiment, a silicon-carbide composite material, preferably aluminum-silicon carbide (AlSiC) or copper-silicon carbide (CuSiC), which have a coefficient of thermal expansion of 5–7 ppm/K, is used as the housing material and the housing is cast from this material. As a result, if the casting mold is designed appropriately, an optimized cooling structure which is optimally adapted in its thermomechanical properties to the Si chips and the ceramic substrate of the submodules can be accomplished in a simple way.

It is conceivable in principle for the entire housing of the cooling device to consist of the material adapted with regard to the coefficient of thermal expansion, in particular the abovementioned composite material. If, however, the cooling structure of the device is designed such that the rear side of the cooler no longer contributes significantly to cooling, according to an alternative embodiment the housing base lying opposite the cooling surface may consist of a different material, preferably of a plastic. As a result, the costs of the device can be reduced considerably.

A further preferred embodiment of the invention is distinguished in that additional means for improving the heat transfer between the cooling surface and the cooling liquid are provided in the liquid space of the device, that the additional means comprise a plurality of pins which protrude from the cooling surface into the liquid space, that the pins consist of the same material as the cooling surface, and that the pins are formed together with the cooling surface in one piece. The thermal resistance of the cooling structure can be optimized for a given coolant flow by suitable choice of the pin diameters, the distance of the pins from one another, and the pin height. It should be noted at this point that the use of such pins is known per se in the case of a cooling device for power semiconductors (see, for example, DE-C2-40 17 749).

Particular favorable cooling conditions are obtained if, according to a development of this embodiment, the pins are cylindrically designed and are oriented with their cylinder axis perpendicular to the cooling surface, and the pins are arranged with a hexagonal symmetry.

In general, the heat from a module is not dissipated uniformly over the entire cooling surface, but locally concentrated at several locations, through the submodules into the cooler. Studies have shown that the spreading of the heat in the cooler, i.e. the lateral distribution of the heat from the location of the submodules, is low, and that it is therefore sufficient if essentially the regions of the submodules are cooled. Therefore, according to a further preferred embodiment, it is provided that the pins are combined in pin groups, and that each of the submodules is assigned a pin group. The cooling can therefore be restricted to a region which is somewhat larger at each border (preferably about 4 mm) than the submodules. If, on the other hand, a larger surface area is cooled, the additional water does not contribute to the cooling but only increases the flow through the cooler.

For this reason, it is also advantageous if means are provided to restrict the flow of the cooling liquid in the liquid space essentially to the regions of the pin groups. If the cooling device is cast from metal-ceramic composites, the cooling surface can also be additionally structured without great expenditure. Since all the surfaces which do not contribute to cooling are excluded from the coolant flow, it is possible to increase the efficiency of the cooler further for a given external flow.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DESCRIPTION OF THE PREFERRED EMBODIMENTS

Figure 1:
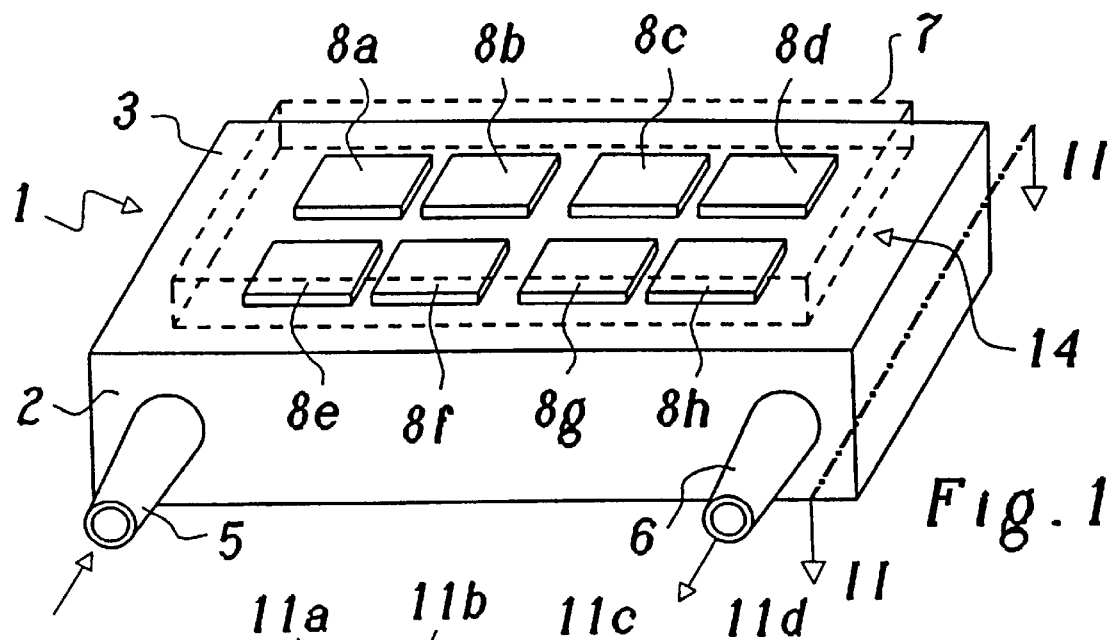
FIG. 1 shows in perspective side view an exemplary embodiment of a high-power semiconductor module with a liquid cooling device according to the invention.

Referring now to the drawings, wherein like reference numerals designate identical or corresponding parts throughout the several views, in FIG. 1 an exemplary embodiment of a high-power semiconductor module 14 with a liquid cooling device 1 according to the invention is represented in a perspective side view. The high-power semiconductor module 14 comprises a plurality of separate submodules 8a–8h, which are arranged next to one another on a cooling surface 3 and, for the sake of simplicity, are reproduced without electrical connecting lines and terminals. The submodules 8a–8h of the module 14 are generally surrounded by a module housing 7, which in FIG. 1 is depicted only by dashed lines.

The individual submodules 8a–8h contain high-power silicon semiconductor devices in chip form, for example thyristor chips, diode chips, IGBT chips or the like. The chips are accommodated together with electrical connection lines on an insulating ceramic substrate, which for its part is fusion-bonded to the cooling surface 3, in particular soldered on. The submodules 8a–8h are separated from one another by interspaces for reasons of insulation and heat distribution.

Figure 2:
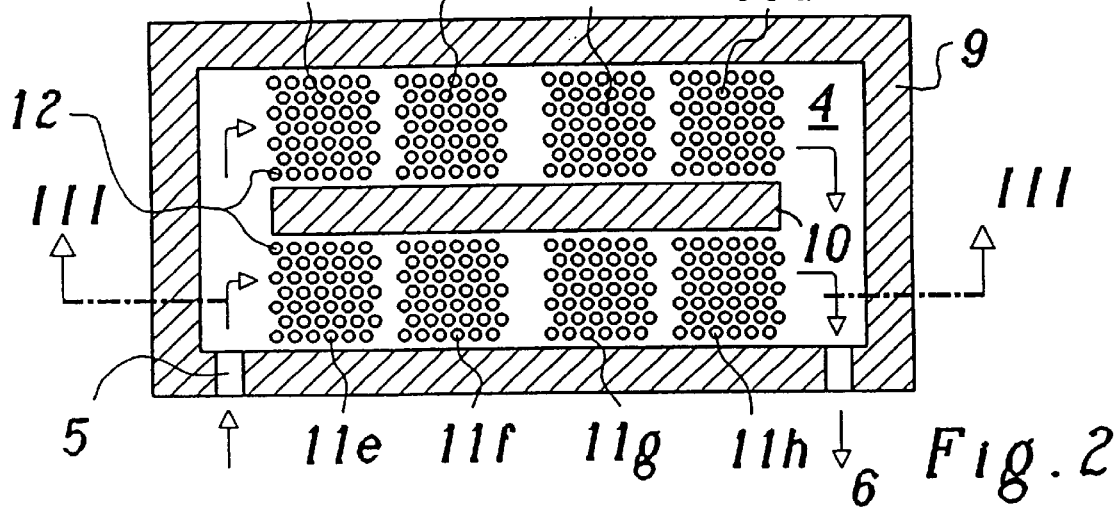
FIG. 2 shows the section through the module according to FIG. 1 in the plane II—II.

The liquid cooling device 1 comprises a closed (in the example of FIG. 1 cuboidal) housing 2, which encloses a liquid space 4 (FIG. 2) through which a cooling liquid flows, and the upper side of which forms the cooling surface 3. The cooling liquid—generally water—is fed to the liquid space 4 in the direction of the depicted arrows through an inlet 5, and the heated liquid is removed again through an outlet 6. Instead of a single inlet and outlet, there may of course be arranged a plurality of inlets and outlets distributed over the device 1.

Underneath the regions in which the submodules 8a–8h are soldered onto the cooling surface 3, cylindrical pins 12, arranged in hexagonal symmetry, protrude from the cooling surface 3 into the liquid space 4. The pins 12 are in this case combined to form pin groups 11a–11h, each submodule 8a–8h being assigned in each case a pin group 11a-11h. Since the pins 12 are produced together with the cooling surface 3 in one piece by casting of the housing 2 from a metal-ceramic composite material, preferably aluminum-silicon carbide (AlSiC) or copper-silicon carbide (CuSiC), and significantly increase the heat transfer between the housing 2 and the cooling liquid, the individual pin groups 11a–11h form within the cooling device 1 regions of greatly reduced heat resistance, which lie directly underneath the submodules and are raised up above them somewhat at the borders. In this way, the cooling takes place with an optimized liquid flow, which is restricted to the core regions to be cooled underneath the submodules, but a particularly good heat transfer occurs there. A further improvement of the cooling efficiency is achieved if the interspaces between the submodule regions are blocked as far as possible for the cooling flow, as takes place in FIG. 2 by an intermediate wall 10 between the rows of submodules. The intermediate wall 10 can be created in a simple way together with the pins 12 during casting of the housing 2.

Figure 3:
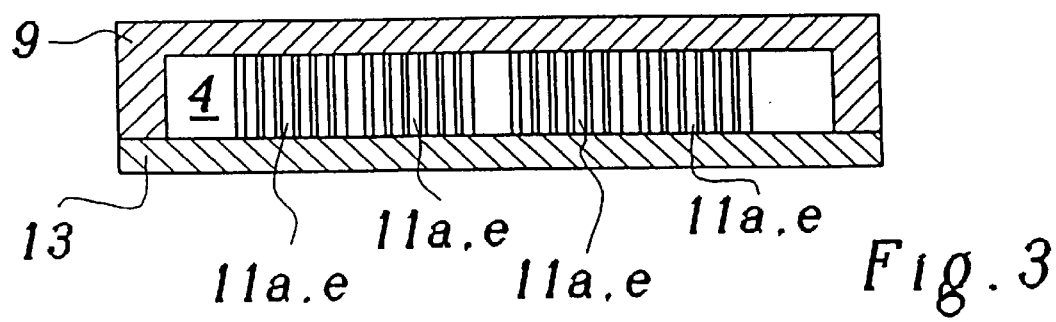
FIG. 3 shows the section through the module according to FIG. 2 along the line III—III.

As already mentioned at the beginning, the thermal resistance $R_{th}$ can be optimized by suitable choice of the pin diameters, of the distance between the pins and the pin height. If it is decided here, as an additional boundary condition for the height of the pins 12, that the rear side of the cooler no longer contributes significantly to the cooling, the rear side of the cooler, to be specific the housing base according to FIG. 3, may be produced from plastic and be adhesively bonded to the remaining housing. It should be pointed out at this stage that, in the case of modules with a correspondingly reduced power loss, the pin structure can be positioned on the plastic side of the cooler. The metal (AlSiC, CuSiC) side of the cooler is then reduced to a simple plate, which can be produced at much lower cost. It should also be noted that it does not necessarily have to be pins that improve the heat transfer. It may also be any desired structures, as long as they remove the heat adequately and can be produced in AlSiC (or CuSiC). In particular, simpler structures, such as elongate ribs for example, are conceivable.

Tests with a cast cooler structure according to the invention (with pin groups) of AlSiC have shown that, with a coolant flow of 4 l/m, a thermal resistance of about 8 K/kW can be achieved. This corresponds to an improvement of 13% in comparison with a conventional cooler made of aluminum. Alternating temperature tests have confirmed that the reduced thermal expansion of the composite cooler leads to a distinct reduction in solder fatigue and consequently to an improvement in the load cycle resistance.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A liquid cooling device for a high-power semiconductor module, comprising:
    a plurality of heat-generating submodules arranged next to one another on a cooling surface, each of the submodules including at least one power semiconductor device coupled to an electrically insulating ceramic substrate having an underside which is fusion-bonded to the cooling surface;
    a housing which encloses a liquid space through which a cooling liquid flows, an upper side of the housing forming the cooling surface, wherein the housing of the liquid cooling device, at least in the region of the cooling surface, is cast from a metal-ceramic composite material having a coefficient of thermal expansion substantially equal to the coefficient of thermal expansion of the ceramic substrates or of the power semiconductor devices of the submodules; and
    heat transferring means for improving the heat transfer between the cooling surface and the cooling liquid in the liquid space of the liquid cooling device.

2. The liquid cooling device as claimed in claim 1, wherein the coefficient of thermal expansion of the housing, material is less than 10 ppm/K.

3. The liquid cooling device as claimed in claim 2, wherein a silicon-carbide composite material is used as the housing material, and wherein the housing is cast from the silicon-carbide composite material.

4. The liquid cooling device as claimed in claim 1, wherein the entire housing of the cooling device consists of:
    the metal-ceramic composite material having the coefficient of thermal expansion substantially equal to the coefficient of thermal expansion of the ceramic substrates or of the power semiconductor devices of the submodules.

5. The liquid cooling device as claimed in claim 1, wherein the housing comprises:
    a base opposite the cooling surface and formed of a material different from said metal-ceramic composite.

6. The liquid cooling device as claimed in claim 1, wherein the heat transferring means for improving the heat transfer comprises:
    a plurality of pins which protrude from the cooling surface into the liquid space.

7. The liquid cooling device as claimed in claim 6, wherein the pins are formed of the same material as the cooling surface, and wherein the pins are formed together with the cooling surface in one piece.

8. The liquid cooling device as claimed in claim 6, wherein the pins are cylindrical and are oriented such that the cylinder axis of each pin is perpendicular to the cooling surface.

9. The liquid cooling device as claimed in claim 6, wherein the pins are arranged with a hexagonal symmetry.

10. The liquid cooling device as claimed in claim 6, wherein the pins are grouped in pin groups, and wherein each of the submodules is assigned a pin group.

11. The liquid cooling device as claimed in claim 10, further comprising:
    conduit means for confining the flow of the cooling liquid in the liquid space substantially to the regions of the pin groups.

12. The liquid cooling device as claimed in claim 2, wherein the entire housing of the cooling device consists of:
    the metal-ceramic composite material having the coefficient of thermal expansion substantially equal to the coefficient of thermal expansion of the ceramic substrates or of the power semiconductor devices of the submodules.

13. The liquid cooling device as claimed in claim 3, wherein the entire housing of the cooling device consists of:
    the metal-ceramic composite material having the coefficient of thermal expansion substantially equal to the coefficient of thermal expansion of the ceramic substrates or of the power semiconductor devices of the submodules.

14. The liquid cooling device as claimed in claim 2, wherein the housing comprises:
    a base opposite the cooling surface and formed of a material different from said metal-ceramic composite.

15. The liquid cooling device as claimed in claim 3, wherein the housing comprises:
    a base opposite the cooling surface and formed of a material different from said metal-ceramic composite.

16. The liquid cooling device as claimed in claim 2, wherein the heat transferring means for improving the heat transfer comprises:
    a plurality of pins which protrude from the cooling surface into the liquid space.

17. The liquid cooling device as claimed in claim 3, wherein the heat transferring means for improving the heat transfer comprises:
    a plurality of pins which protrude from the cooling surface into the liquid space.

18. The liquid cooling device as claimed in claim 4, wherein the heat transferring means for improving the heat transfer comprises:
    a plurality of pins which protrude from the cooling surface into the liquid space.

19. The liquid cooling device as claimed in claim 5, wherein the heat transferring means for improving the heat transfer comprises:
    a plurality of pins which protrude from the cooling surface into the liquid space.

20. The liquid cooling device as claimed in claim 7, wherein the pins are cylindrical and are oriented such that the cylinder axis of each pin is perpendicular to the cooling surface.

21. A liquid cooling device for a high-power semiconductor module, comprising:
    a plurality of heat-generating submodules arranged next to one another on a cooling surface, each of the submodules including at least one power semiconductor device coupled to an electrically insulating ceramic substrate having an underside which is fusion-bonded to the cooling surface;

a housing which encloses a liquid space through which a cooling liquid flows, an upper side of the housing forming the cooling surface, wherein the housing of the liquid cooling device, at least in the region of the cooling surface, is cast from a metal-ceramic composite material having a coefficient of thermal expansion less than 10 ppm/K; and heat transferring means for improving the heat transfer between the cooling surface and the cooling liquid in the liquid space of the liquid cooling device.

22. The liquid cooling device as claimed in claim 21, wherein the metal-ceramic composite material has a coefficient of thermal expansion less than 7 ppm/K.

* * * * *